(12) United States Patent
Ballou et al.

(10) Patent No.: US 10,001,588 B2
(45) Date of Patent: Jun. 19, 2018

(54) ENHANCED, PROTECTED SILVER COATINGS ON ALUMINUM FOR OPTICAL MIRROR AND METHOD OF MAKING SAME

(71) Applicant: Corning Incorporated, Corning, NY (US)

(72) Inventors: Jason Ballou, Gilsum, NH (US); Frederick Gagliardi, Jaffrey, NH (US)

(73) Assignee: Corning Incorporated, Corning, NY (US)

( * ) Notice: Subject to any disclaimer, the term of this patent is extended or adjusted under 35 U.S.C. 154(b) by 635 days.

(21) Appl. No.: 14/452,912

(22) Filed: Aug. 6, 2014

(65) Prior Publication Data
US 2014/0349097 A1 Nov. 27, 2014

Related U.S. Application Data

(62) Division of application No. 13/296,383, filed on Nov. 15, 2011, now Pat. No. 8,828,526.
(Continued)

(51) Int. Cl.
*G02B 5/08* (2006.01)
*G02B 1/14* (2015.01)
(Continued)

(52) U.S. Cl.
CPC ........ *G02B 5/0875* (2013.01); *C23C 14/0641* (2013.01); *C23C 14/165* (2013.01); *C23C 14/5826* (2013.01); *C23C 14/5853* (2013.01); *C23C 16/505* (2013.01); *G02B 1/105* (2013.01); *G02B 1/14* (2015.01); *G02B 5/08* (2013.01);
(Continued)

(58) Field of Classification Search
CPC .............. C23C 14/0641; C23C 14/165; C23C 14/5826; C23C 14/5853; C23C 16/505; G02B 1/105; G02B 5/08; G02B 5/0875; Y10T 428/24942; Y10T 428/24975
See application file for complete search history.

(56) References Cited

U.S. PATENT DOCUMENTS 6,078,425 A 6/2000 Wolfe et al. .................. 359/584
6,174,610 B1 1/2001 Ohmi
(Continued)

FOREIGN PATENT DOCUMENTS

EP 0632294 4/1995
JP H05-100107 4/1993
(Continued)

OTHER PUBLICATIONS

JP2006126827—macinne translation.
(Continued)

*Primary Examiner* — Lawrence Ferguson
(74) *Attorney, Agent, or Firm* — Kevin L. Bray

(57) ABSTRACT

The disclosure is directed to enhanced silver coated aluminum substrates for use as optical mirrors in which galvanic corrosion between the silver and aluminum is prevented and a method of making such silver coating and mirrors. The optical mirror according to the disclosure has an in-situ formed "barrier" layer inserted between the aluminum substrate and the silver layer. In addition, selected layers are densified by carrying out their deposition using a high power RF ion source during their deposition.

4 Claims, 2 Drawing Sheets

Related U.S. Application Data

(60) Provisional application No. 61/414,962, filed on Nov. 18, 2010.

(51) Int. Cl.
 *C23C 14/06* (2006.01)
 *C23C 14/16* (2006.01)
 *C23C 14/58* (2006.01)
 *G02B 1/10* (2015.01)
 *C23C 16/505* (2006.01)

(52) U.S. Cl.
 CPC ............... *Y10T 428/24942* (2015.01); *Y10T 428/24975* (2015.01)

(56) References Cited

U.S. PATENT DOCUMENTS

| | | |
|---|---|---|
| 7,374,300 B2 | 5/2008 | Mehrtens et al. |
| 2006/0141272 A1 | 6/2006 | Wolfe ............... 428/457 |
| 2007/0141383 A1* | 6/2007 | Chen ............... C23C 28/321 428/627 |
| 2010/0086775 A1 | 4/2010 | Lairson et al. ............... 428/336 |

FOREIGN PATENT DOCUMENTS

| | | |
|---|---|---|
| JP | H07-005309 | 1/1995 |
| JP | H11-183713 | 7/1999 |
| JP | 2005-250229 | 9/2005 |
| JP | 2006126827 | 5/2006 |
| JP | 2007072190 | 3/2007 |

OTHER PUBLICATIONS

Jimmie L. Williams, "Monolith structures, materials, properties and uses", Catalysis Today, 69, (2001), 3-9.
PCT/US2011/060082—May 30, 2013 Search Report.

* cited by examiner

Figure 1

| 22 |
|---|
| 20 |
| 18 |
| 16 |
| 14 |
| 12 |
| 10 | even_____

ENHANCED, PROTECTED SILVER COATINGS ON ALUMINUM FOR OPTICAL MIRROR AND METHOD OF MAKING SAME

PRIORITY

This application is a divisional of U.S. application Ser. No. 13/296,383, filed on Nov. 15, 2011 and claims priority from and the benefit of U.S. Provisional Application No. 61/414,962, filed on Nov. 18, 2010, both of which are hereby incorporated by reference for all purposes as if fully set forth herein.

FIELD

The disclosure is directed to enhanced silver coated aluminum substrates for use as optical mirrors in which galvanic corrosion between the silver and aluminum is prevented and a method of making such silver coating and mirrors.

BACKGROUND

While there have been many attempts to produce silver coated aluminum mirrors, such attempts have been unsuccessful due to the nature of the two materials, the aluminum substrate and the silver thin film coating. When silver is coated on an aluminum substrate a negative reaction occurs that is referred to as "galvanic corrosion" which dramatically impacts the life expectancy for the mirror. Galvanic corrosion is the result of a chemical reaction that occurs when a pair of dissimilar metals comes into contact with each other, for example, silver and aluminum. The effect of the reaction is to dissolve the member of the pair of metals which is "anodic" to the other. Since aluminum substrates, for example, T6061 aluminum, is anodic to most of the common metals (see Table 1 herein: "Galvanic Table from MIL-STD-889"), metallic mirror coatings, particularly silver coatings, applied to enhance reflectivity of the aluminum substrate will adversely affect its, aluminum's, natural corrosion resistance. U.S. Pat. No. 6,078,425 and U.S. Patent application Publication No. 2006/0141272 disclose alternative methods of making silver coated mirrors. However, there are still problems with coating silver on aluminum substrates to form mirrors. Thus there is a need for further improvements such as that which is described in the present disclosure.

SUMMARY

In one embodiment the present disclosure is directed to a coating deposition process utilizing a combination of materials and techniques that produces a front surface optical mirror coating that withstands the rigors of mechanical, environmental, and spectral testing. In the process a high power RF ion source is utilized in the initial pre-cleaning stage of the process which conditions the surface to be coated, for example, an aluminum surface, and removes any potential contaminates. After the cleaning process has been completed a "barrier" layer of chromium nitride ("CrN") is deposited or formed in-situ, in a nitrogen/argon atmosphere, utilizing the RF ion source to assist the evaporant and also to increase the packing density which eliminates or minimizes any voids or "pinholes" in the barrier layer film as it is deposited and formed. When the "barrier" layer has been formed, the silver is then evaporated and deposited on the chromium nitride layer followed by a layer of chromium (as a binder layer) which is then treated with an ion glow plasma discharge, in the presence of oxygen, to fully oxidize the chromium binder layer and form a chromium oxide layer. Once the chromium binder layer has been fully oxidized one or a plurality of enhancement (overcoat) layers is/are deposited sequentially to produce a mirror having the desired reflectivity; for example, a silver-coated mirror on an aluminum substrate. The foregoing mirror is protected from the environment by the enhancement layers and prevented from undergoing a galvanic reaction with the aluminum substrate due to the in-situ formed chromium nitride layer between the aluminum substrate and the silver layer. The use of the RF ion source during formation of the chromium nitride layer produces a densified CrN layer that is without or has a minimized number of voids or pinholes that can lead to the galvanic reaction between silver and aluminum.

In another embodiment, the disclosure is directed to a silver mirror having enhanced galvanic corrosion resistance, said mirror consisting essentially of an aluminum substrate having a layer of in-situ formed chromium nitride layer having a thickness in the range of 50-150 nm on the aluminum substrate, a silver layer having a thickness in the range of 75-150 nm on the chromium nitride layer, a formed chromium oxide layer having a thickness in the range of 0.1-0.6 nm on top of the silver layer, and one of a plurality of enhancing layers formed on the chromium oxide layer; and when a plurality of enhancing layers are used, different materials are used in alternating adjacent layers. For example, if a three layer enhancing structure is used, then the structure can be an A-B-A structure where, for example, A is silicon dioxide and B is niobium pentoxide. In one embodiment the chromium nitride layer thickness is in the range of 50-125 nm. In another embodiment the chromium nitride layer thickness is in the range of 75-125 nm. In an embodiment the silver layer thickness is in the range of 75-150 nm. In another embodiment the silver layer thickness is in the range of 100-130 nm. The one or plurality of enhancing layer are individually selected from the group consisting of silicon dioxide, silicon monoxide, niobium pentoxide, ytterbium fluoride, titanium dioxide, tantalum pentoxide, magnesium fluoride, yttrium fluoride, aluminum oxide, yttrium oxide, zirconium oxide, hafnium oxide or combinations thereof. However, when a plurality of enhancing layers is used, different materials are used in alternating adjacent layers. For example, the plurality of enhancing layers can have a structure such as A-B-A, A-B-C, A-B-A-C and so forth provided that different materials are used in the alternating adjacent layers. The individual enhancing layers can each individually have a thickness in the range of 10-100 nm; and when a plurality of enhancing layers are used each layer can have a different thickness within the 10-100 nm range.

In an additional embodiment the disclosure is directed to a high reflective silver mirror as illustrated in FIG. 1, the mirror consisting of an aluminum substrate 10 having a chromium nitride layer 12 of thickness in the range of 50-125 nm in situ formed on the aluminum substrate layer 10, a silver coating layer 14 having a thickness in the range of 75-150 nm deposited on the chromium nitride layer 12, a formed chromium oxide layer 16 having a thickness in the range of 1-6 Angstroms (0.1-0.6 nm) deposited on the silver layer 14, and a three layer enhancement, a first enhancing layer 18 having a thickness in the range of 30-80 nm deposited on the chromium oxide layer 16, a second enhancing layer 20 having a thickness in the range of 15-100 nm deposited on the first enhancing layer 18 and a third enhancing layer 22 having a thickness in the range of 10-100 nm deposited on the second enhancing layer 20. In a specific example the enhancing layers were a first silicon dioxide layer 18 having a thickness in the range of 40-60 nm deposited on the chromium oxide layer 16, a niobium pentoxide layer 20 having a thickness in the range of 15-30 nm deposited on the first silicon dioxide layer 18 and a second silicon dioxide layer 22 having a thickness in the range of 40-60 nm deposited on the niobium pentoxide layer 20.

BRIEF DESCRIPTION OF THE DRAWINGS

FIG. 1 is a schematic drawing illustrating the film structure according to the disclosure on an aluminum substrate.

DETAILED DESCRIPTION

Figure 2:
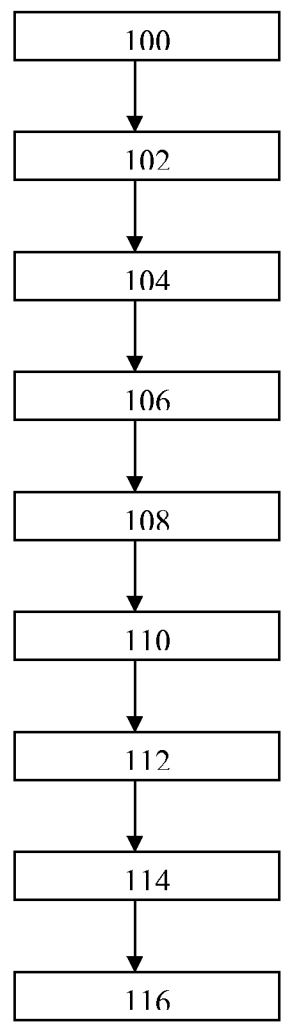
FIG. 2 is a process flow chart illustrating steps of the disclosure for preparing an enhanced protected silver coating on an aluminum substrate.

The process for making a silver mirror using an aluminum substrate as described herein utilizes a commercial RF ion gun for surface treatment before deposition of any materials and during deposition of the of the barrier, binding, and certain enhancing layers to enable high deposition rates and increase the film packing density which also aids in improving the life time of the product.

FIG. 2 is a process flow chart illustrating the method of the present disclosure. Prior to using the following process the substrates are meticulously cleaned, inspected, and placed into a nitrogen purged container until such a time that they are ready to be loaded into the vacuum chamber.

The process as illustrated in FIG. 2 has the steps of:

loading the product tooling (substrate) to be coated into the coating chamber [100];

evacuating the coating chamber to a pressure of <3×10$^{-6}$ Torr [102];

performing an RF pre-clean @300-500 W with approximately 10 sccm argon flow through the chamber for in the range of 7-15 minutes [104];

depositing an in situ formed chromium nitride barrier layer to a thickness in the range of 50-150 nm [106] by deposition of chromium (Cr), also called chrome in some arts, in a flow of approximately 30 sccm N$_2$ and 5 sccm Ar (approximately 6/1 V/V N$_2$/Ar at a RF power of 400 W [108] that thereby converts the chromium to chromium nitride;

turning off the RF power and depositing a silver layer to a thickness in the range of 75-150 nm [108];

with the RF source off and no gas flowing, deposit a chromium (Cr) layer having a thickness in the range of 0.1-0.6 nm [110];

turning on the RF power to a setting of 200-300 W and providing an oxygen flow of approximately 50 sccm, and maintaining these conditions to fully oxidize the chrome layer [112] into a chromium oxide layer, also called the formed chromium oxide layer;

depositing one or a plurality of enhancing layers [114]; and venting and clearing the chamber, for example, using nitrogen or air, and removing the coated mirror from the chamber [116].

Figure 1:
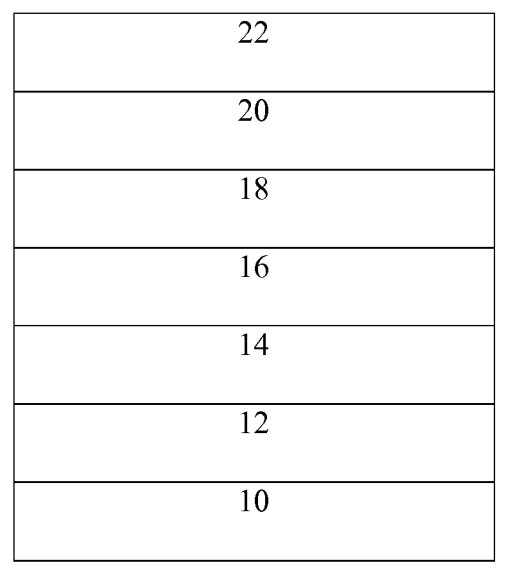

An example of a plurality of enhancing layers is illustrated in FIG. 1 as three layers that have been deposited in the following order as (i) a first silicon dioxide layer 18 having a thickness in the range of 40-60 nm, (ii) a niobium pentoxide layer 20 having a thickness in the range of 15-30 nm, and (iii) a second silicon dioxide layer 22 having a thickness in the range of 40-60 nm. Other materials can be used alone or in combination as enhancing layer materials as is described below.

In the process as described above in 106 chrome or chromium (Cr) is the metal being deposited. However, when the deposition is carried out using a mixture of pure nitrogen (99.999%) and argon (99.999%) by flowing through the RF on source (power level of 400 W) at a rate of 28/3.5 sccm, respectively, the chrome is altered to form a layer of chromium nitride. In similar fashion, in 110 chrome is the metal being deposited to a target thickness in the range of 4-6 nm, and after the metal has been deposited step 112 is carried out whereby the chrome is oxidized to chromium oxide. The time required to oxidize the chromium metal to chromium oxide is in the approximate range of 7-8 minutes. Further, in one embodiment the RF pre-clean step is carried to a time in the range of 8-12 minutes.

In an example, a silver coated mirror was prepared using an aluminum substrate. The coating on the mirror, prepared as described herein, from the aluminum substrate to the last applied coating layer (which is an enhancement layer), had measured thicknesses of 100 nm CrN, 120 nm Ag, 0.45 nm (4.5 Angstroms) chrome oxide, 55.3 nm first layer silicon dioxide, 20.9 nm niobium pentoxide and 53.8 nm second layer silicon dioxide. The variation in each thickness was ±5% except for the chrome oxide layer which can have a variation of ±10%.

The final phase of the process, as represented in FIG. 2 by 114, is the additional depositions of what are frequently referred to as is referred to as the enhancing layers. These layers can be any combination of metals, typically as oxides or fluorides, which are deposited on top of the oxidized chromium layer 112 to increase reflectivity in different wavelength regions. Materials utilized in this process can include silicon dioxide, silicon monoxide, niobium pentoxide, ytterbium fluoride, titanium dioxide, tantalum pentoxide, yttrium fluoride, hafnium oxide, magnesium fluoride, aluminum oxide, yttrium oxide, zirconium oxide, or combinations thereof, for example without limitation, silicon aluminum oxide, etc. While the "enhancing" can be carried out using only a single layer, it is typically carried out using a plurality of layers in the range of three to nine alternating layers. When a plurality of enhancing layers is used, different materials are used in alternating adjacent layers; for example without limitation. A-B-A and A-B-C-A, A-B-A-B, et cetera.

TABLE 1

Galvanic Table From MIL-STD-889

| Active (Anodic) | Chromium (Plated) | Monel 400 |
|---|---|---|
| Magnesium | Tantalum | Stainless steel 201 (active) |
| Mg alloy AZ-31B | AM350 (active) | Carpenter 20 (active) |
| Mg alloy HK-31A | Stainless steel 310 (active) | Stainless steel 321 (active) |
| Zinc (hot-dip, die cast, or plated) | Stainless steel 301 (active) | Stainless steel 316 (active) |
| | Stainless steel 304 (active) | Stainless steel 309 (active) |

TABLE 1-continued

Galvanic Table From MIL-STD-889

| | | |
|---|---|---|
| Beryllium (hot pressed) | Stainless steel 430 (active) | Stainless steel 17-7PH |
| Al 7072 clad on 7075 | Stainless steel 410 (active) | (passive) |
| Al 2014-T3 | Stainless steel 17-7PH | Silicone Bronze 655 |
| Al 1160-H14 | (active) | Stainless steel 304 (passive) |
| Al 7079-T6 | Tungsten | Stainless steel 301 (passive) |
| Cadmium (plated) | Niobium (columbium) 1% Zr | Stainless steel 321 (passive) |
| Uranium | Brass, Yellow, 268 | Stainless steel 201 (passive) |
| Al 218 (die cast) | Uranium 8% Mo. | Stainless steel 286 (passive) |
| Al 5052-0 | Brass, Naval, 464 | Stainless steel 316L (passive) |
| Al 5052-H12 | Yellow Brass | AM355 (active) |
| Al 5456-0, H353 | Muntz Metal 280 | Stainless steel 202 (passive) |
| Al 5052-H32 | Brass (plated) | Carpenter 20 (passive) |
| Al 1100-0 | Nickel-silver (18% Ni) | AM355 (passive) |
| Al 3003-H25 | Stainless steel 316L (active) | A286 (passive) |
| Al 6061-T6 | Bronze 220 | Titanium 5Al, 2.5 Sn |
| Al A360 (die cast) | Copper 110 | Titanium 13V, 11Cr, 3Al |
| Al 7075-T6 | Red Brass | (annealed) |
| Al 6061-0 | Stainless steel 347 (active) | Titanium 6Al, 4V (solution |
| Indium | Molybdenum, Commercial | treated and aged) |
| Al 2014-0 | pure | Titanium 6Al, 4V (anneal) |
| Al 2024-T4 | Copper-nickel 715 | Titanium 8 Mn |
| Al 5052-H16 | Admiralty brass | Titanium 13V, 11Cr 3Al |
| Tin (plated) | Stainless steel 202 (active) | (solution heat treated and |
| Stainless steel 430 (active) | Bronze, Phosphor 534 (B-1) | aged) |
| Lead | Monel 400 | Titanium 75A |
| Steel 1010 | Stainless steel 201 (active) | AM350 (passive) |
| Iron (cast) | Carpenter 20 (active) | Silver |
| Stainless steel 410 (active) | Stainless steel 321 (active) | Gold |
| Copper (plated, cast, or | Stainless steel 316 (active) | Graphite |
| wrought)) | | End - Noble (Less Active, |
| Nickel (plated) | | Cathodic) |
| Chromium (Plated) | | |
| Tantalum | | |
| AM350 (active) | | |
| Stainless steel 310 (active) | | |

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. A silver mirror having enhanced galvanic corrosion resistance, said mirror consisting essentially of an aluminum substrate having an in-situ formed chromium nitride layer having a thickness in the range of 50-150 nm on the aluminum substrate, a silver layer having a thickness in the range of 75-150 nm on the chromium nitride layer, a formed chromium oxide layer having a thickness in the range of 0.1-0.6 nm on the top of the silver layer, and one or a plurality of enhancing layers formed on the chromium oxide layer;
wherein when a plurality of enhancing layers is used, different materials are used in alternating adjacent enhancing layers and each individual enhancing layer has a thickness in the range of 10-100 nm.

2. The silver mirror according to claim 1, wherein the chromium nitride layer thickness is in the range of 75-125 nm.

3. The silver mirror according to claim 1, wherein the silver layer thickness is in the range of 100-130 nm.

4. The silver mirror according to claim 1, wherein the enhancing layers are individually selected from the group consisting of silicon dioxide, silicon monoxide, niobium pentoxide, ytterbium fluoride, titanium dioxide, tantalum pentoxide, magnesium fluoride, yttrium fluoride, aluminum oxide, yttrium oxide, zirconium oxide, hafnium oxide or combinations thereof.

* * * * *

UNITED STATES PATENT AND TRADEMARK OFFICE
CERTIFICATE OF CORRECTION

PATENT NO. : 10,001,588 B2
APPLICATION NO. : 14/452912
DATED : June 19, 2018
INVENTOR(S) : Jason Ballou et al.

Page 1 of 1

It is certified that error appears in the above-identified patent and that said Letters Patent is hereby corrected as shown below:

On the Title Page

Column 1, item (56), other publications, Line 1, delete "macinne" and insert -- machine --, therefor.

Signed and Sealed this
Seventh Day of April, 2020

Andrei Iancu
*Director of the United States Patent and Trademark Office*